US 6,554,432 B2

(12) United States Patent
Ohfune et al.

(10) Patent No.: US 6,554,432 B2
(45) Date of Patent: Apr. 29, 2003

(54) LIQUID CRYSTAL PROJECTOR

(75) Inventors: Kenji Ohfune, Daito (JP); Satoshi Nakajo, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/075,304

(22) Filed: Feb. 15, 2002

(65) Prior Publication Data

US 2002/0118342 A1 Aug. 29, 2002

(30) Foreign Application Priority Data

Feb. 27, 2001 (JP) ........................................ 2001-053026

(51) Int. Cl.⁷ ............................................... G03B 21/18
(52) U.S. Cl. .............................. 353/57; 353/52; 353/58
(58) Field of Search ............................. 353/52, 57, 58, 353/119, 122; 349/1

(56) References Cited

U.S. PATENT DOCUMENTS 6,139,155 A * 10/2000 Takizawa ..................... 353/57
6,322,218 B1 * 11/2001 Sugawara et al. ............ 353/52
6,419,364 B2 * 7/2002 Takizawa et al. ............. 353/52

FOREIGN PATENT DOCUMENTS

JP          04060533 A   *   2/1992   ............ G03B/21/16

* cited by examiner

Primary Examiner—David M. Gray
Assistant Examiner—Michelle Nguyen
(74) Attorney, Agent, or Firm—Rader, Fishman & Grauer PLLC

(57) ABSTRACT

In a liquid crystal projector provided with a cooling fan, the liquid crystal projector comprises a plurality of temperature sensors for detecting the internal temperature of the liquid crystal projector and a fan control circuit for controlling a driving voltage for the cooling fan on the basis of a temperature detected by each of the temperature sensors, the fan control circuit comprising means for calculating, on the basis of the temperature detected by each of the temperature sensors and a temperature range determined depending on the position where the temperature sensor is mounted, the ratio of the detected temperature to the temperature range for the temperature sensor; and means for controlling the driving voltage for the cooling fan on the basis of the maximum of the ratio of the detected temperature to the temperature range which has been calculated for each of the temperature sensors.

6 Claims, 4 Drawing Sheets

LIQUID CRYSTAL PROJECTOR

BACKGROUND OF THE INVENTION

1. Field of the Invention

The present invention relates to a liquid crystal projector.

2. Description of the Prior Art

In liquid crystal projectors, a liquid crystal panel, a light source lamp for backlight arranged on a rear surface of the liquid crystal panel, a signal processing circuit, and a power supply circuit are provided in a casing. Cooling fans for cooling the liquid crystal panel, the light source lamp for backlight, and so on are provided in the casing of the liquid crystal projector. Conventionally, the higher the number of revolutions of the cooling fan is, the more the cooling efficiency is improved. However, noise is increased.

In a case where the internal temperature of the liquid crystal projector is detected, to determine a control voltage for the cooling fan in proportion to the detected temperature, when only one temperature sensor is employed, and a driving voltage for the cooling fan is controlled on the basis of the temperature detected by the temperature sensor, the internal temperature of the liquid crystal projector is determined depending on the position where the one temperature sensor is mounted.

Inside the liquid crystal projector, it is considered that there occurs a temperature difference in its inner place depending on various factors, for example, the temperature of the outside air and judgment whether or not there is a sufficient space in the vicinity of a vent hole. When the temperature partially rises inside the liquid crystal projector, the partial rise in the temperature cannot, in some cases, be detected depending on the position where the temperature sensor is mounted.

SUMMARY OF THE INVENTION

An object of the present invention is to provide a liquid crystal projector capable of detecting, when the temperature partially rises inside a liquid crystal projector, the partial rise in the temperature and controlling a driving voltage for a cooling fan.

In a liquid crystal projector provided with a cooling fan, a first liquid crystal projector according to the present invention is characterized by comprising a plurality of temperature sensors for detecting the internal temperature of the liquid crystal projector and a fan control circuit for controlling a driving voltage for the cooling fan on the basis of a temperature detected by each of the temperature sensors, the fan control circuit comprising means for calculating, on the basis of the temperature detected by each of the temperature sensors and a temperature range determined depending on the position where the temperature sensor is mounted, the ratio of the detected temperature to the temperature range for the temperature sensor, and means for controlling the driving voltage for the cooling fan on the basis of the maximum of the ratio of the detected temperature to the temperature range which has been calculated for each of the temperature sensors.

In a liquid crystal projector provided with a cooling fan, a second liquid crystal projector according to the present invention is characterized by comprising a plurality of temperature sensors for detecting the internal temperature of the liquid crystal projector and a fan control circuit for controlling a driving voltage for the cooling fan on the basis of a temperature detected by each of the temperature sensors, the fan control circuit comprising a circuit for calculating, on the basis of the temperature detected by each of the temperature sensors and a temperature range determined depending on the position where the temperature sensor is mounted, the ratio of the detected temperature to the temperature range for the temperature sensor, and a circuit for controlling the driving voltage for the cooling fan on the basis of the maximum of the ratio of the detected temperature to the temperature range which has been calculated for each of the temperature sensors.

When there are two temperature sensors, one of the temperature sensors is arranged in the vicinity of a light source lamp for backlight, for example, and the other temperature sensor is arranged at the position where the temperature thereof is close to the temperature of the outside air, for example.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
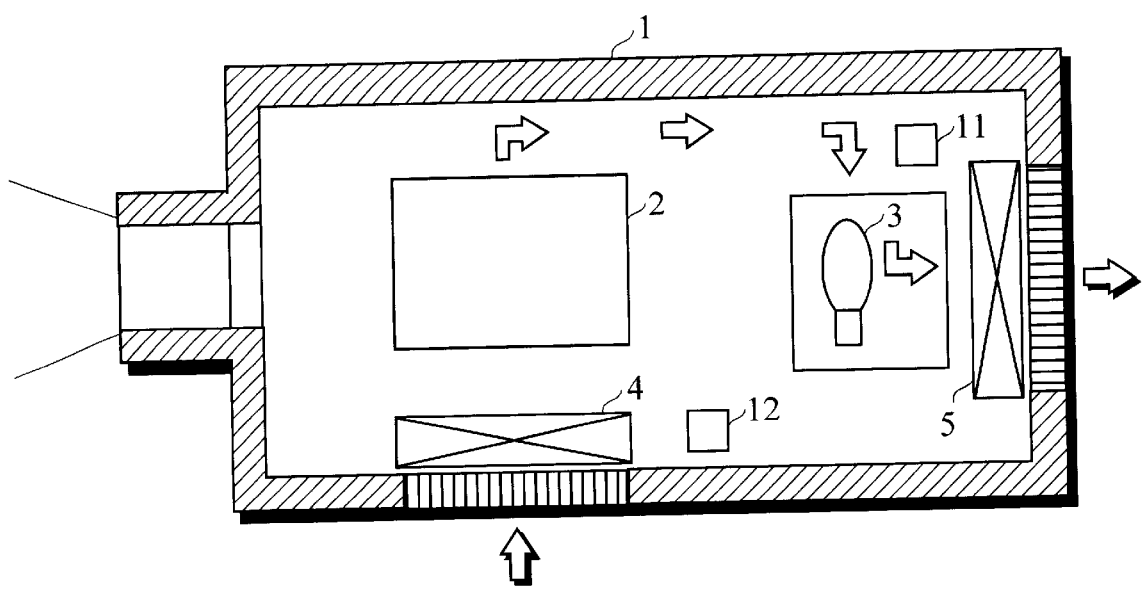
FIG. 1 is a schematic view showing the schematic configuration of a liquid crystal projector.

Referring now to the drawings, an embodiment of the present invention will be described.

FIG. 1 illustrates the schematic configuration of a liquid crystal projector.

A liquid crystal panel 2 is provided in a casing 1 of the liquid crystal projector. A light source lamp for backlight 3 is arranged on the right side (on a rear surface) of the liquid crystal panel 2. A suction fan (a cooling fan) 4 is arranged on the lower side of the liquid crystal panel 2. An exhaust fan (a cooling fan) 5 is arranged on the right side of the light source lamp for backlight 3.

Two temperature sensors 11 and 12 are arranged in the casing 1 in this example. The temperature sensors 11 and 12 are arranged at different positions. In this example, one of the temperature sensors 11 is arranged in the vicinity of the light source lamp for backlight 3. The other temperature sensor 12 is arranged in the vicinity of the suction fan 4, that is, at the position where the temperature thereof is a temperature close to the temperature of the outside air.

In the present embodiment, driving voltages (rotational speeds) of the suction fan 4 and the exhaust fan 5 are respectively controlled on the basis of the temperatures detected by the temperature sensors 11 and 12.

Figure 2:
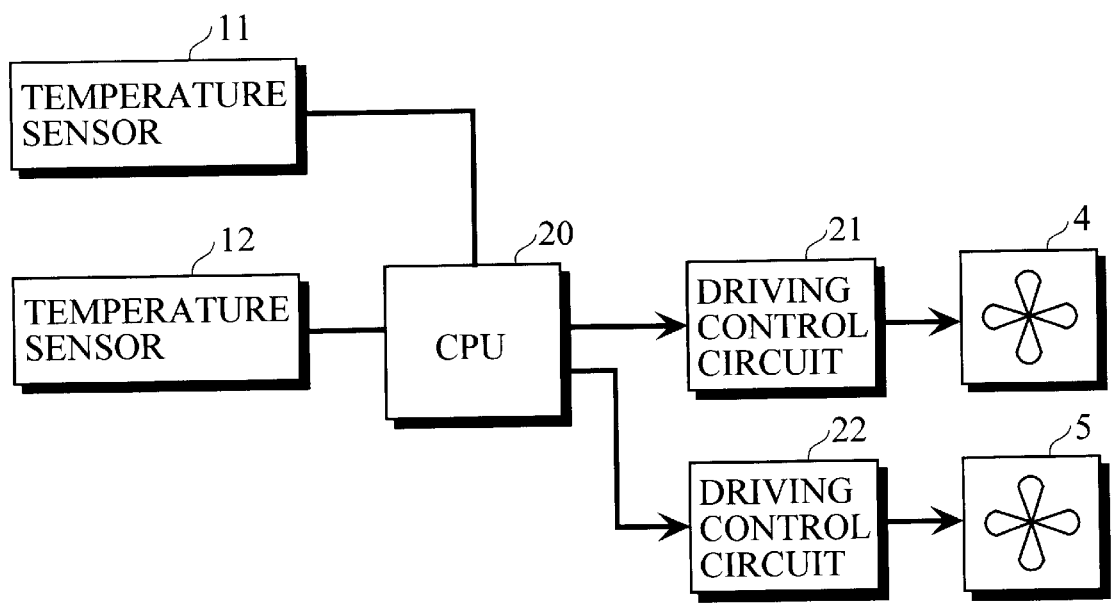
FIG. 2 is a block diagram showing the configuration of a circuit for controlling a suction fan 4 and an exhaust fan 5.

FIG. 2 illustrates a circuit for controlling the suction fan 4 and the exhaust fan 5.

An output of each of the temperature sensors 11 and 12 is inputted to a CPU 20. The CPU 20 outputs a control signal to a driving control circuit 21 of the suction fan 4 and a driving control circuit 22 of the exhaust fan 5. Since a driving control method of the suction fan 4 and a driving control method of the exhaust fan 5 are the same and hence, only the driving control method of the suction fan 4 will be described.

Figure 3:
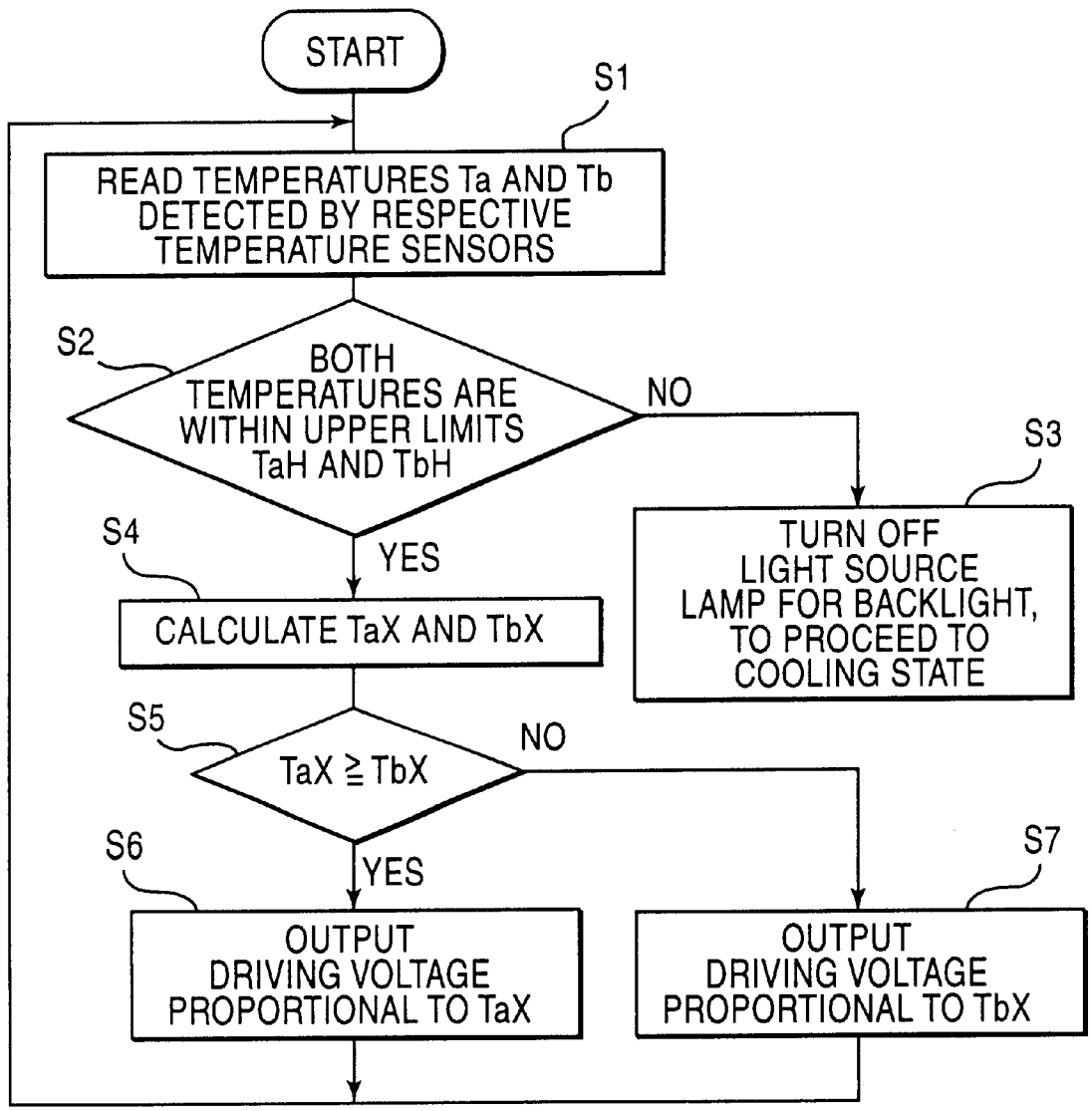
FIG. 3 is a flow chart showing the procedure for fan control processing by a CPU 20.

FIG. 3 shows the procedure for fan control processing by the CPU 20.

The CPU 20 reads a temperature detected by each of the temperature sensors 11 and 12 at a predetermined time interval, for example, every 1.5 seconds (step 1).

For each of the temperature sensors 11 and 12, a temperature range at the position where the temperature sensor is mounted is previously determined depending on the position. Let Ta be the temperature detected by the temperature sensor 11, and let TaL to TaH (TaL<TaH) be a temperature range at the position where the temperature sensor 11 is mounted. Let Tb be the temperature detected by the temperature sensor 12, and let TbL to TbH (TbL<TbH) be a temperature range at the position where the temperature sensor 12 is mounted.

Figure 4:
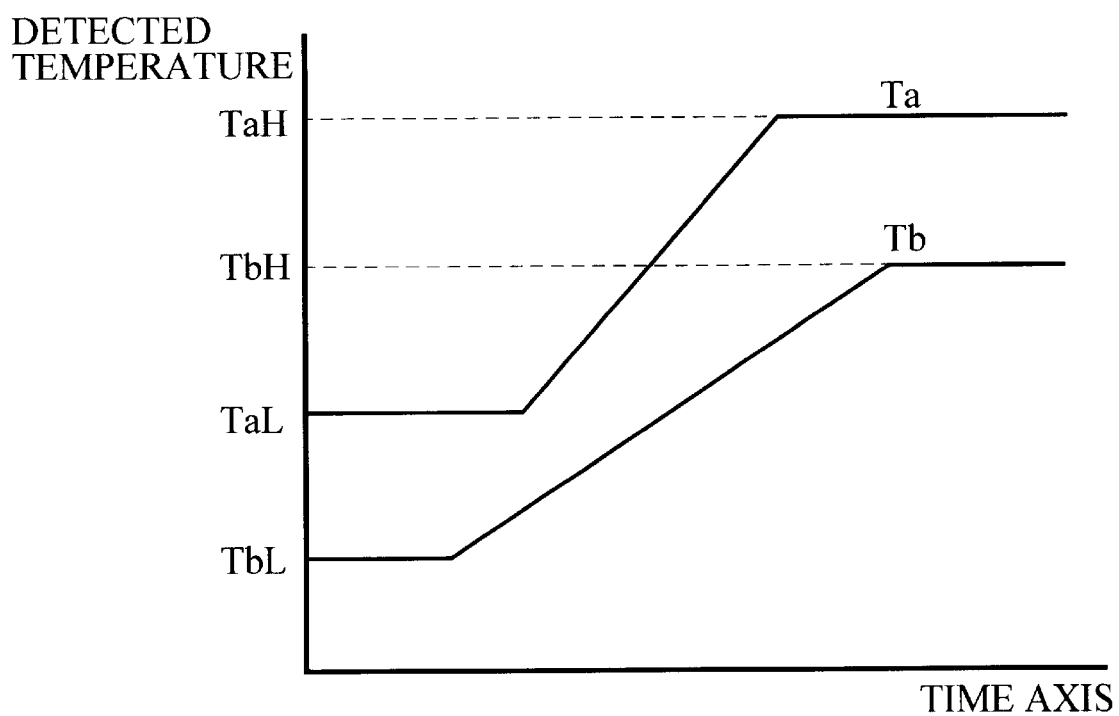
FIG. 4 is a graph showing how a temperature detected by each of temperature sensors 11 and 12 is changed.

FIG. 4 shows how the temperature detected by each of the temperature sensors 11 and 12 is changed. As shown in FIG. 4, the upper limit TaH of the temperature range of the temperature sensor 11 is set to a value higher than the upper limit TbH of the temperature range of the temperature sensor 12.

The CPU 20 judges, when it reads the temperature Ta and Tb detected by the temperature sensors 11 and 12, whether or not the temperatures respectively exceed the upper limits TaH and TbH of the temperature ranges at the positions where the temperature sensors are mounted (step 2).

When either one of the detected temperatures Ta and Tb exceeds the upper limit TaH or TbH of the temperature range at the position where the temperature sensor is mounted, the CPU 20 turns off the light source lamp for backlight 3, to proceed to a cooling state (step 3).

When both the detected temperatures Ta and Tb are respectively not more than the upper limits TaH and TbH of the temperature ranges at the positions where the temperature sensors are mounted, the CPU 20 calculates the ratios TaX and TbX of the detected temperatures to the temperature ranges for the temperature sensors, respectively, on the basis of the following equations (1) and (2) (step 4).

$$TaX = (Ta-TaL)/(TaH-TaL) \quad (1)$$

$$TbX = (Tb-TbL)/(TbH-TbL) \quad (2)$$

The CPU 20 judges whether or not TaX is not less than TbX (step 5). When TaX is not less than TbX, the CPU 20 outputs a driving voltage proportional to TaX to the driving control circuit 21 (step 6). The program is returned to the step 1.

When TaX is less than TbX, the CPU 20 outputs a driving voltage proportional to TbX to the driving control circuit 21 (step 7). The program is returned to the step 1.

In the present embodiment, when the temperature partially rises inside the liquid crystal projector, the number of revolutions of each of the cooling fans 4 and 5 is increased on the basis of the temperature detected by the temperature sensor arranged in the place where the temperature rises, thereby making it possible to enhance the safety.

Although in the above-mentioned embodiment, there are two temperature sensors, there may be provided three or more temperature sensors. When there are provided three or more temperature sensors, a driving voltage for a cooling fan is controlled on the basis of the maximum of the ratio of a detected temperature to a temperature range calculated for each of the temperature sensors.

Although the present invention has been described and illustrated in detail, it is clearly understood that the same is by way of illustration and example only and is not to be taken by way of limitation, the spirit and scope of the present invention being limited only by the terms of the appended claims.

What is claimed:

1. In a liquid crystal projector provided with a cooling fan, the liquid crystal projector comprising:
   a plurality of temperature sensors for detecting an internal temperature of the liquid crystal projector; and
   a fan control circuit for controlling a driving voltage for the cooling fan on a basis of the temperature detected by each of the temperature sensors,
   the fan control circuit comprising
      means for calculating, on the basis of the temperature detected by each of the temperature sensors and a temperature range determined depending on a position where the temperature sensor is mounted, a ratio of the detected temperature to the temperature range for each temperature sensor, and
      means for controlling a driving voltage for the cooling fan on a basis of a maximum ratio of the detected temperature to the temperature range which has been calculated for each of the temperature sensors.

2. The liquid crystal projector according to claim 1, wherein
   there are two temperature sensors,
   one of the temperature sensors being arranged in the vicinity of a light source lamp for backlight, and
   the other temperature sensor being arranged at the position where the temperature thereof is close to the temperature of the outside air.

3. In a liquid crystal projector provided with a cooling fan, the liquid crystal projector comprising:
   a plurality of temperature sensors for detecting an internal temperature of the liquid crystal projector; and
   a fan control circuit for controlling a driving voltage for the cooling fan on a basis of a temperature detected by each of the temperature sensors,
   the fan control circuit comprising
      a circuit for calculating, on the basis of the temperature detected by each of the temperature sensors and a temperature range determined depending on a position where the temperature sensor is mounted, a ratio of the detected temperature to the temperature range for each temperature sensor, and
      a circuit for controlling a driving voltage for the cooling fan on a basis of a maximum ratio of the detected temperature to the temperature range which has been calculated for each of the temperature sensors.

4. The liquid crystal projector according to claim 3, wherein
   there are two temperature sensors,
   one of the temperature sensors being arranged in the vicinity of a light source lamp for backlight, and
   the other temperature sensor being arranged at the position where the temperature thereof is close to the temperature of the outside air.

5. In a liquid crystal projector provided with a cooling fan, the liquid crystal projector comprising:
   a plurality of temperature sensors for detecting the internal temperature of the liquid crystal projector; and a fan control circuit for controlling a driving voltage for the cooling fan on the basis of the temperature detected by each of the temperature sensors, the fan control circuit comprising means for calculating a ratio of the detected temperature to a temperature range for each temperature sensor based upon the following formula:

$$Tx=(T_d-T_L)/(T_H-T_L)$$

wherein Tx is the calculated ratio; $T_d$ is the detected temperature and $T_H$ and $T_L$ are an upper limit temperature and a lower limit temperature respectively of the temperature range, and means for controlling the driving voltage for the cooling fan on the basis on a maximum one of the ratios of the detected temperature to the temperature range which has been calculated for the temperature sensors.

6. In a liquid crystal projector provided with a cooling fan, the liquid crystal projector comprising:

a plurality of temperature sensors for detecting the internal temperature of the liquid crystal projector; and a fan control circuit for controlling a driving voltage for the cooling fan on the basis of a temperature detected by each of the temperature sensors, the fan control circuit comprising a circuit for calculating a ratio of the detected temperature to a temperature range for each temperature sensor based upon the following formula:

$$Tx=(T_d-T_L)/(T_H-T_L)$$

wherein Tx is the calculated ratio; $T_d$ is the detected temperature and $T_H$ and $T_L$ are an upper limit temperature and a lower limit temperature respectively of the temperature range, and a circuit for controlling a driving voltage for the cooling fan on the basis of a maximum one of the ratios of the detected temperature to the temperature range which has been calculated for the temperature sensors.

* * * * *